US007196418B2

(12) United States Patent
Ohno et al.

(10) Patent No.: US 7,196,418 B2

(45) Date of Patent: Mar. 27, 2007

(54) SEMICONDUCTOR DEVICE AND STACKED SEMICONDUCTOR DEVICE THAT CAN INCREASE FLEXIBILITY IN DESIGNING A STACKED SEMICONDUCTOR DEVICE

(75) Inventors: Takao Ohno, Kawasaki (JP); Eiji Yoshida, Kawasaki (JP); Hiroshi Misawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 11/042,347

(22) Filed: Jan. 26, 2005

(65) Prior Publication Data

US 2005/0161793 A1 Jul. 28, 2005

Related U.S. Application Data

(63) Continuation of application No. PCT/JP02/13198, filed on Dec. 17, 2002.

(51) Int. Cl.
*H01L 23/34* (2006.01)

(52) U.S. Cl. ...................................... 257/723; 257/777

(58) Field of Classification Search ................ 257/777, 257/686, 778, 723

See application file for complete search history.

(56) References Cited

U.S. PATENT DOCUMENTS 5,347,159 A * 9/1994 Khandros et al. ........... 257/692
5,801,439 A * 9/1998 Fujisawa et al. ............ 257/686
6,329,708 B1 12/2001 Komiyama
6,376,769 B1 * 4/2002 Chung ........................ 174/524
6,876,074 B2 * 4/2005 Kim ........................... 257/686
6,998,704 B2 * 2/2006 Yamazaki et al. .......... 257/688
2001/0054762 A1 12/2001 Yamazaki et al.

FOREIGN PATENT DOCUMENTS

JP 2001-85592 3/2001
JP 2002-329835 11/2002
JP 2003-7899 1/2003

* cited by examiner

*Primary Examiner*—Roy Potter
(74) *Attorney, Agent, or Firm*—Westerman, Hattori, Daniels & Adrian, LLP.

(57) ABSTRACT

A semiconductor device includes a semiconductor element having a plurality of electrodes provided on one principal surface thereof and a wiring substrate having a conductive layer on an insulating substrate. The wiring substrate is arranged in a substantially U-shape along an outer edge of the semiconductor element. An end of the conductive layer of the wiring substrate is connected to the electrodes of the semiconductor element. The other end of the conductive layer extends in a direction opposite to the semiconductor element on the other principal surface side of the semiconductor element.

12 Claims, 16 Drawing Sheets

100
110
111
102
101
104
103
105
106
108
107
109

10B
4
11
600
1
1c
9
1b
1a

SEMICONDUCTOR DEVICE AND STACKED SEMICONDUCTOR DEVICE THAT CAN INCREASE FLEXIBILITY IN DESIGNING A STACKED SEMICONDUCTOR DEVICE

CROSS-REFERENCE TO RELATED APPLICATION

This application is a U.S. continuation application, filed under 35 USC 111(a) and claiming the benefit under 35 USC 120 and 365(c), of PCT application PCT/JP02/13198, filed Dec. 17, 2002. The foregoing application is hereby incorporated herein by reference.

BACKGROUND OF THE INVENTION

1. Field of the Invention

The present invention generally relates to semiconductor devices, and more particularly, to a stacked semiconductor device formed by stacking semiconductor elements.

2. Description of the Related Art

Recently, with the improvement in performance of semiconductor devices, stacked semiconductor devices formed by stacking multiple semiconductor elements have been widely used. In such stacked semiconductor devices, wire bonding is generally used as a wiring method of making interconnections between semiconductor elements.

FIG. 1 shows an exemplary structure of a stacked semiconductor device 100 in which interconnections are made by using wire bonding.

Referring to FIG. 1, a semiconductor element 101 is mounted on an interposer 111 via an insulating body 103, and a semiconductor element 102 is mounted on the semiconductor element 101 via an insulating body 104. The semiconductor element 101 includes, for example, an active element (not shown) and a passive element (not shown). A wiring connection portion 105, which is connected to the active element and the passive element, for example, is interconnected to a contact portion 109 of the interposer 111 by wire bonding with the use of a wire 107.

Similarly, the semiconductor element 102 includes an active element (not shown) and a passive element (not shown). A wiring connection portion 106, which is connected to the active element and the passive element, for example, is interconnected to a contact portion 109 of the interposer 111 by wire bonding with the use of a wire 108. The semiconductor elements 101 and 102 and the wires 107 and 108, for example, are fixed to the interposer 111 by a MOLD resin 110.

In the case of the stacked semiconductor device 100 using wire bonding as mentioned above, there is concern about problems due to variations caused in wire bonding process, such as differences in the loop shapes of wires, or variations in the resistance values of the wire connection portions and the connection portions of the wires.

Additionally, it is necessary to expose the wire connection portions on the semiconductor elements in order to make interconnections by wires. Hence, when stacking semiconductor elements, there is a limit in the size that an upper semiconductor element must be always smaller than a lower semiconductor element. Thus, there is a problem in that flexibility in designing is limited in the case of forming a stacked semiconductor device.

SUMMARY OF THE INVENTION

Accordingly, a general object of the present invention is to provide an improved and useful semiconductor device in which one or more of the above-mentioned problems are eliminated.

Another and more specific object of the present invention is to provide a semiconductor device having a higher accuracy in wiring compared to wire bonding, which is a wiring technique for conventional semiconductor devices, and including wiring and a semiconductor element with less variations caused during processing.

A further object of the present invention is to eliminate a limit in the sizes of semiconductor elements in the case of stacking the semiconductor elements so as to increase flexibility in designing a stacked semiconductor device.

In order to achieve the above-mentioned objects, according to one aspect of the present invention, there is provided a semiconductor device that includes a semiconductor element having a plurality of electrodes provided on one principal surface thereof and a wiring substrate having a conductive layer on an insulating substrate, wherein the wiring substrate is arranged in a substantially U-shape along an outer edge of the semiconductor element, an end of the conductive layer of the wiring substrate is connected to the electrodes of the semiconductor element, and the other end of the conductive layer extends in a direction opposite to the semiconductor element on the other principal surface side of the semiconductor element.

According to the present invention, the wiring using the conductive layers of the wiring substrate is formed to extend along the outer edge portion of the semiconductor element. Hence, compared to conventional wiring formed in a loop shape, it is possible to reduce the wiring length at the time when the wiring is formed and to keep variations in the wiring length to a minimum.

Additionally, according to the present invention, by providing a conductive layer on an insulating substrate to form a wiring substrate, and arranging the wiring substrate to extend along the outer edge of the semiconductor element, it is possible to stack another semiconductor element on the wiring substrate. Hence, it is possible to stack, on a semiconductor element, another semiconductor element having the same size as or a larger size than the semiconductor element. Thus, a limit imposed on the sizes of semiconductor elements when forming a stacked semiconductor element is eliminated. Accordingly, flexibility in designing a stacked semiconductor device is increased.

Other objects, features and advantages of the present invention will become more apparent from the following detailed description when read in conjunction with the following drawings.

DETAILED DESCRIPTION OF THE PREFERRED EMBODIMENTS

Referring to FIGS. 2 through 15, a description is given of embodiments of the present invention.

Figure 1:
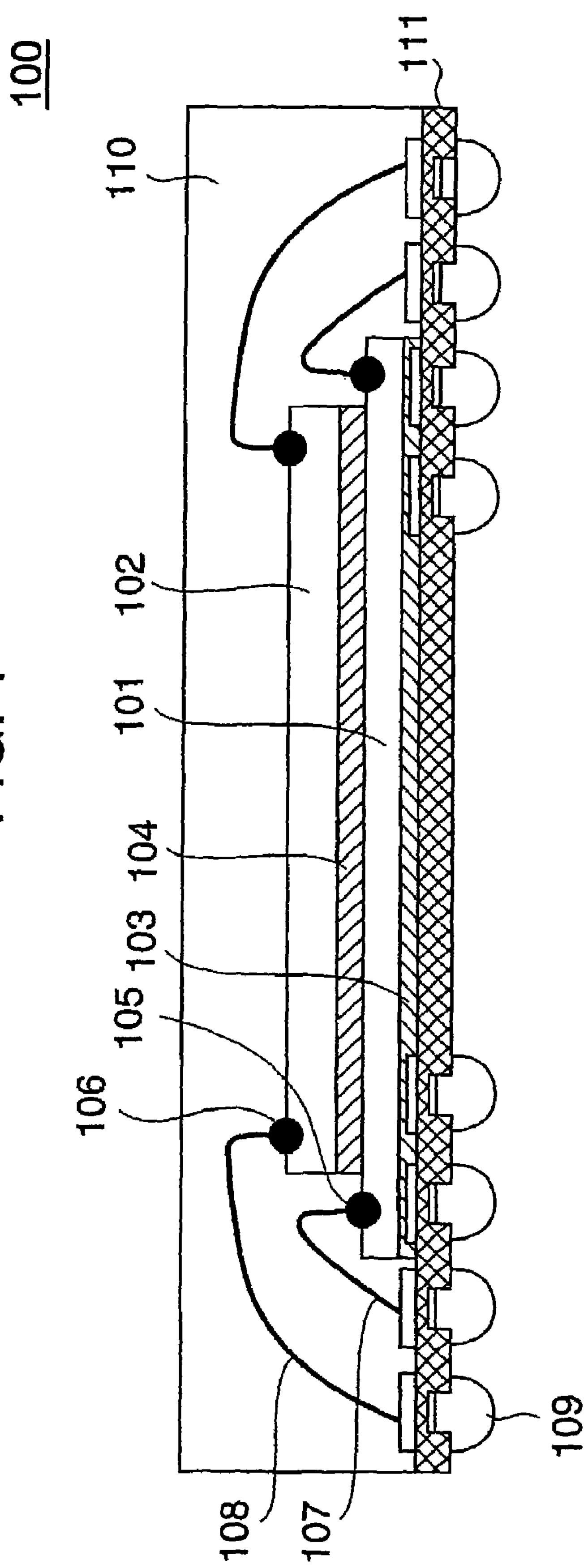
FIG. 1 is a diagram showing the structure of a stacked semiconductor device using conventional wire bonding.
Figure 2:
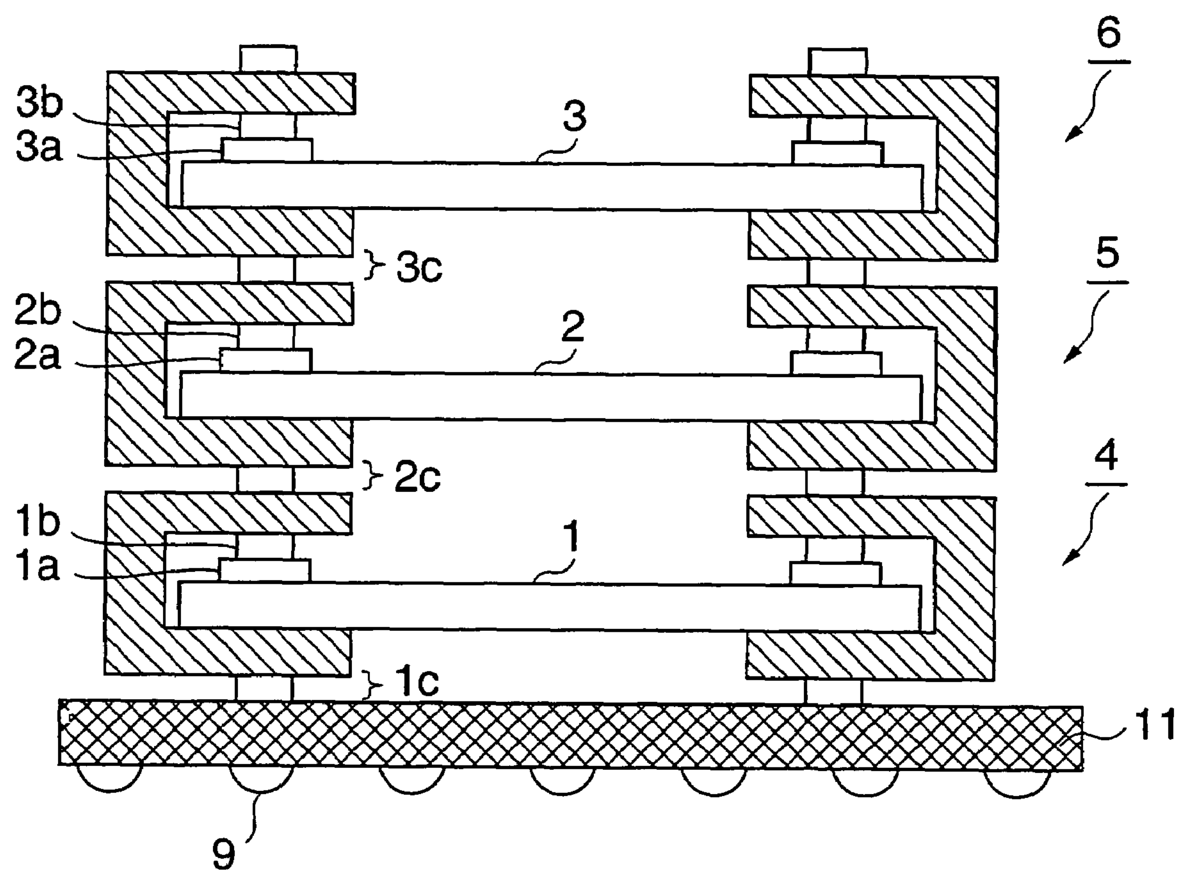
FIG. 2 is a diagram showing the structure of a stacked semiconductor device according to the present invention in the case where semiconductor elements are of the same size.

FIG. 2 is a cross-sectional view of the structure of a stacked semiconductor device 10 according to the present invention. Referring to FIG. 2, the stacked semiconductor device 10 generally includes semiconductor elements 1 through 3 mounted on an interposer 11. The semiconductor elements 1 through 3 are held by stacking components 4 through 6, respectively. Each of the stacking components 4 through 6 is configured to extend from the bottom surface of a semiconductor element to the side surface thereof, and to further extend along the outer edge of the top surface.

Elements such as an active element not shown) and a passive element (not shown) are formed on each of the semiconductor elements 1 through 3. Wiring connection portions 1*a* through 3*a,* which are connected to the above-mentioned elements, are provided on the semiconductor elements 1 through 3, respectively. Wiring contact portions 1*b* through 3*b* are provided on the wiring connection portions 1*a* through 3*a,* respectively. The wiring contact portions 1*b* through 3*b* are connected to wiring portions (described below) provided to the stacking components 4 through 6, respectively.

The above-mentioned wiring portions and stacking contact portions 1*c* through 3*c,* which are provided on the bottom portion of the stacking components 4 through 6, form wiring of the stacked semiconductor device 10. The formed wiring is connected to a contact portion 9 of the interposer 11 via the stacking contact portion 1*c*. A detailed description of the structure of such wiring is given below.

As mentioned above, the stacked semiconductor device is formed by using the stacking components that include the wiring portions as alternatives to conventional wire bonding. Hence, it is possible to mount a semiconductor element in a space above the wiring connection portion of another semiconductor element. Accordingly, as shown in FIG. 2, it is possible to form a stacked semiconductor device by stacking semiconductor elements of the same size.

Figure 3:
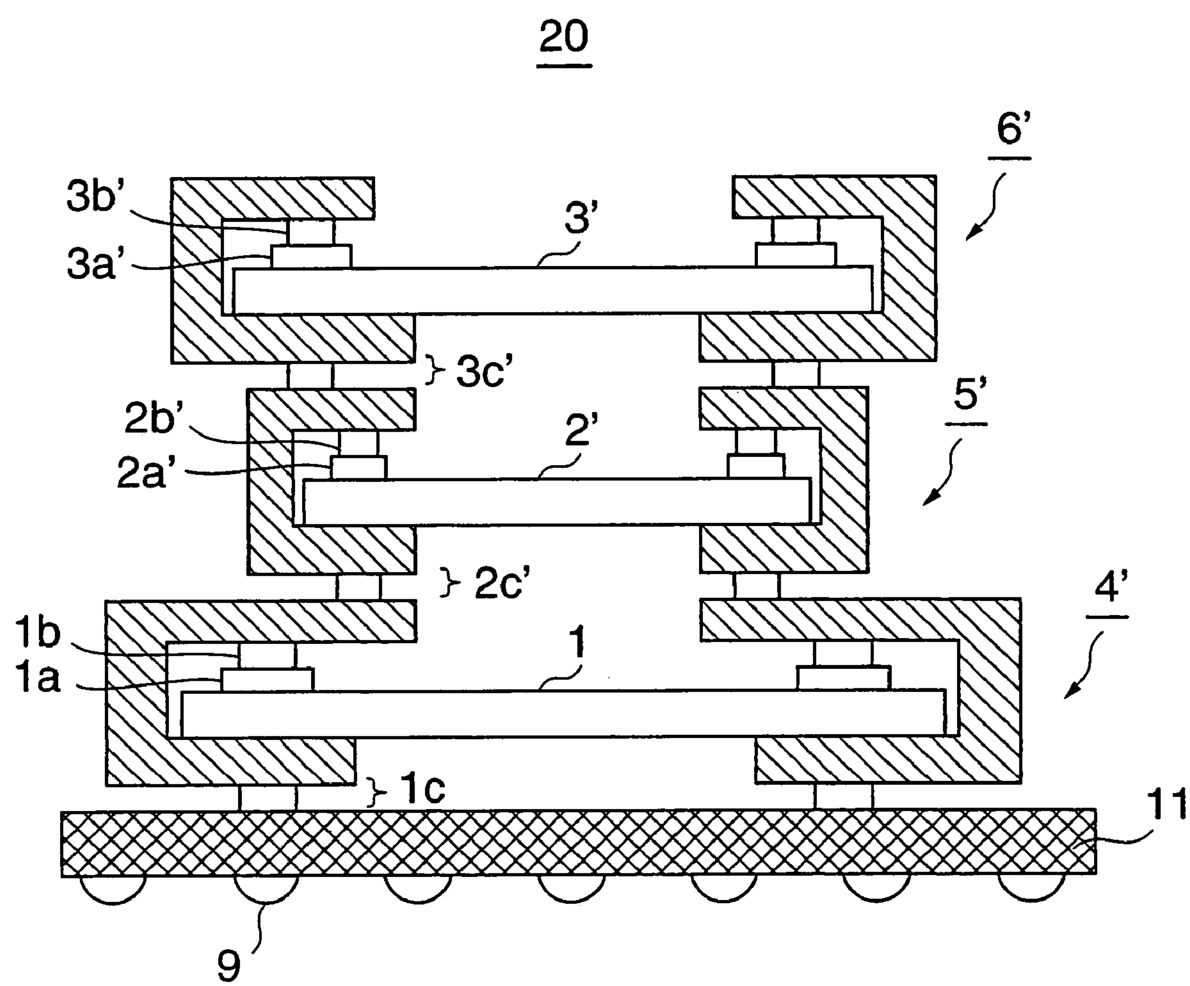
FIG. 3 is a diagram showing the structure of a stacked semiconductor device according to the present invention in the case where semiconductor elements are of different sizes.

Further, in the case where a stacked semiconductor device is formed by using such stacking components, in addition to semiconductor elements of the same size, it is possible to form a stacked semiconductor device with semiconductor elements of different sizes as shown in FIG. 3. Thus, a limit imposed on the sizes of semiconductor elements in forming a stacked semiconductor device is eliminated.

FIG. 3 is a cross-sectional view of a stacked semiconductor device 20 formed by the semiconductor element 1, a semiconductor element 2', and a semiconductor element 3' of different sizes with the use of stacking components 4', 5' and 6' as mentioned above. In FIG. 3, those parts that are described above are designated by the same reference numerals, and a description thereof is omitted.

Referring to FIG. 3, the semiconductor element 1 is mounted on the interposer 11. The semiconductor element 2', having a smaller size than the semiconductor element 1, is stacked on the semiconductor element 1. The semiconductor element 3', having a size larger than the semiconductor element 2' but smaller than the semiconductor element 1, is stacked on the semiconductor element 2'. The semiconductor elements 1, 2' and 3' are held by the stacking components 4', 5' and 6', respectively. Each of the stacking components 4', 5' and 6' is configured to extend from the bottom surface of a semiconductor element to the side surface thereof, and to further extend along the outer edge of the top surface of the semiconductor element.

Elements such as an active element (not shown) and a passive element (not shown) are formed on one principal surface (top surface) of each of the semiconductor elements 1, 2' and 3'. Wiring connection portions 1*a*, 2*a'*, and 3*a'* to be connected to such elements are provided on the principal surfaces of the semiconductor elements 1, 2' and 3', respectively. Further, wiring contact portions 1*b*, 2*b'* and 3*b'* are provided on the wiring connection portions 1*a*, 2*a'* and 3*a'*, respectively. The wiring contact portions 1*b*, 2*b'* and 3*b'* are connected to wiring portions (described below) provided on the stacking components 4', 5' and 6', respectively.

The above-mentioned wiring portions and stacking contact portions 1*c* through 3*c*, which are provided on the bottom portion of the stacking components 4' through 6' to be connected o the wiring portions, form wiring of the stacked semiconductor device 10. The formed wiring is connected to the contact portion 9 of the interposer 11 via the stacking contact portion 1*c*.

As shown in FIG. 3, by using the above-mentioned stacking components, it is possible to form a stacked semiconductor device in which a semiconductor element having a larger size than another semiconductor element is stacked thereon. That is, since a limit imposed on the sizes of semiconductor elements in forming a stacked semiconductor device is eliminated, there is an effect that flexibility in designing a stacked semiconductor device is increased.

Figure 4:
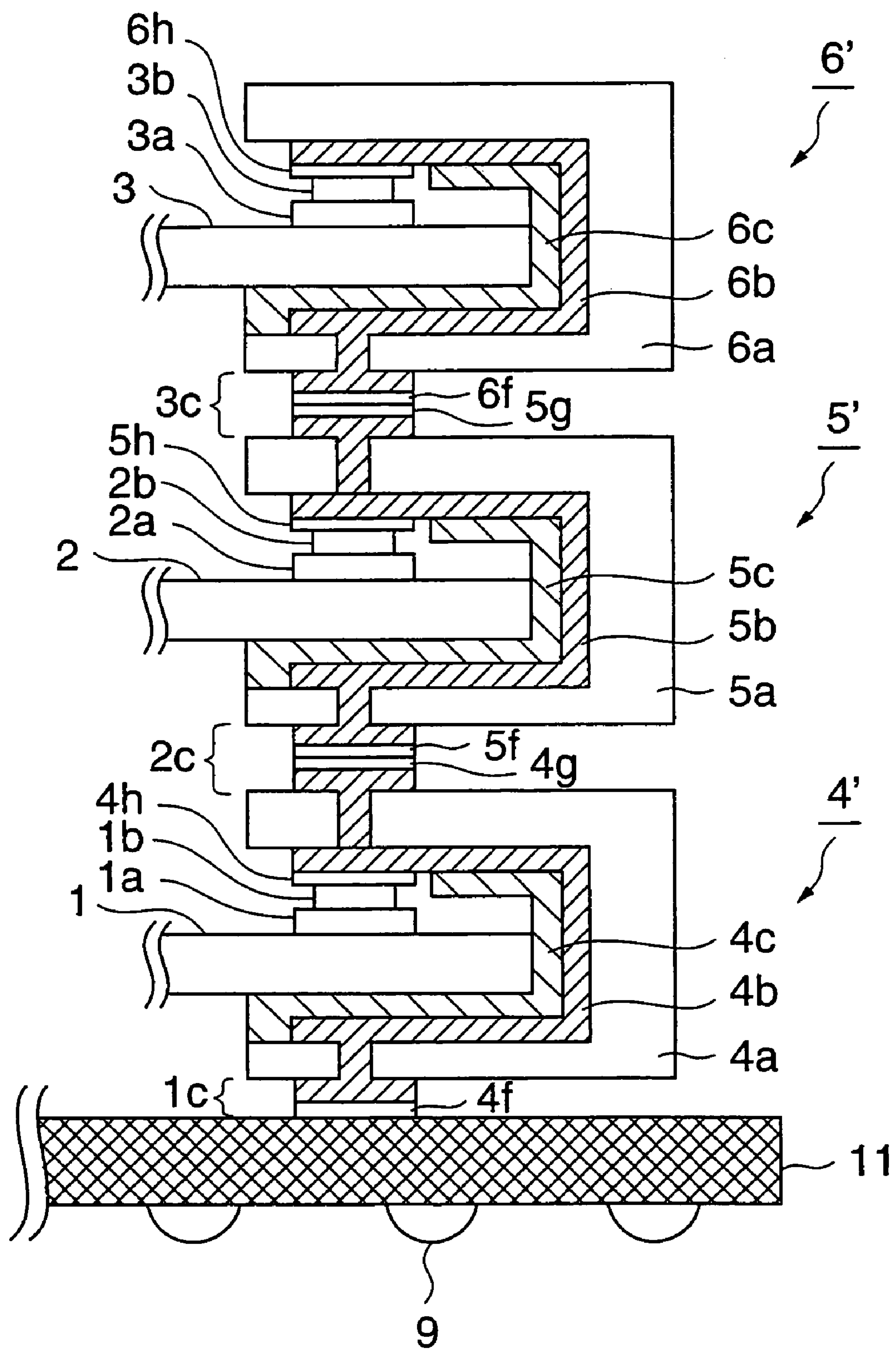
FIG. 4 is a diagram showing a wiring method of the stacked semiconductor device shown in FIG. 2.

Next, referring to FIG. 4, a detailed description is given of a wiring method using the above-mentioned stacking components. FIG. 4 is an enlarged view of a part of the stacked semiconductor device 10 shown in FIG. 2. In FIG. 4, those parts that are described above are designated by the same reference numerals, and a description thereof is partially omitted.

Referring to FIG. 4, first, a description is given of the stacking component 4'. The stacking component 4' generally includes a wiring substrate 4*a*, a wiring part 4*b*, and a protection layer 4*c*. The wiring substrate 4*a* is formed by bending a thin plate, which is made of an insulating body, in a substantially U-shape so as to extend along the bottom surface, the side surface, and the outer edge of the top surface of the semiconductor element 1. The wiring part 4*b* is formed on a surface of the wiring substrate 4*a*, which surface internally contacts the semiconductor element 1. The protection layer 4*c* is made of an insulating body and is formed on the inner side of the wiring part 4*b*.

The wiring part 4*b* extends outside of the wiring substrate 4*a* via a throughhole of the wiring substrate 4*a*, which throughhole is provided on the top-surface side (the side on which the wiring connection portion is provided) of the semiconductor element 1, and a contact electrode 4*g* is formed on the wiring part 4*b*. Similarly, the wiring part 4*b* extends outside of the wiring substrate 4*a* via a throughhole of the wiring substrate 4*a*, which throughhole is provided on the bottom-surface side of the semiconductor element 1 (the opposite side of the top-surface side), and a contact electrode 4*f* is formed on the wiring part 4*b*.

The contact electrode 4*g* is connected to a contact electrode 5*f*, which contacts a wiring part 5*b* provided in the stacking component 5'. The contact electrode 4*f* is electrically connected to the contact portion 9, which is provided on the bottom surface of the interposer 11, via a wiring part (not shown) formed on the interposer 11. In addition, the wiring part 4*b* and the wiring contact portion 1*b* are connected to each other via a contact electrode 4*h*.

The wiring part 5*b* provided in the stacking component 5' is interposed between a wiring substrate 5*a* and a protection layer 5*c*, as in the case of the wiring part 4*b*. The wiring part 5*b* is formed to extend along the bottom surface, the outer edge, and the top surface of the semiconductor element 2.

The wiring part 5*b* extends outside of the wiring substrate 5*a* via a throughhole of the wiring substrate 5*a*, which throughhole is provided on the top-surface side (the side on which the wiring connection portion is provided) of the semiconductor element 2. A contact electrode 5*g* is formed on the wiring part 5*b*. In addition, the wiring part 5*b* and the wiring contact portion 2*b* are connected to each other via a contact electrode 5*h*.

Next, referring to the stacking component 6', a wiring part 6*b* provided in the stacking component 6' is interposed between a wiring substrate 6*a* and a protection layer 6*c*, as in the cases of the wiring parts 4*b* and 5*b*. The wiring part 6*b* is formed to extend along the bottom surface, the outer edge, and the top surface of the semiconductor element 3.

The wiring part 6*b* extends outside of the wiring substrate 6*a* via a throughhole of the wiring substrate 6*a*, which throughhole is provided on the bottom-surface side of the semiconductor element 3. A contact electrode 6*f* is provided on the wiring part 6*b*. The wiring part 6*b* is connected to the wiring part 5*b* via the contact electrodes 6*f* and 5*g*. Additionally, the wiring part 6*b* and the wiring contact portion 3*b* are connected to each other via the contact electrode 6*h*.

Figure 5:
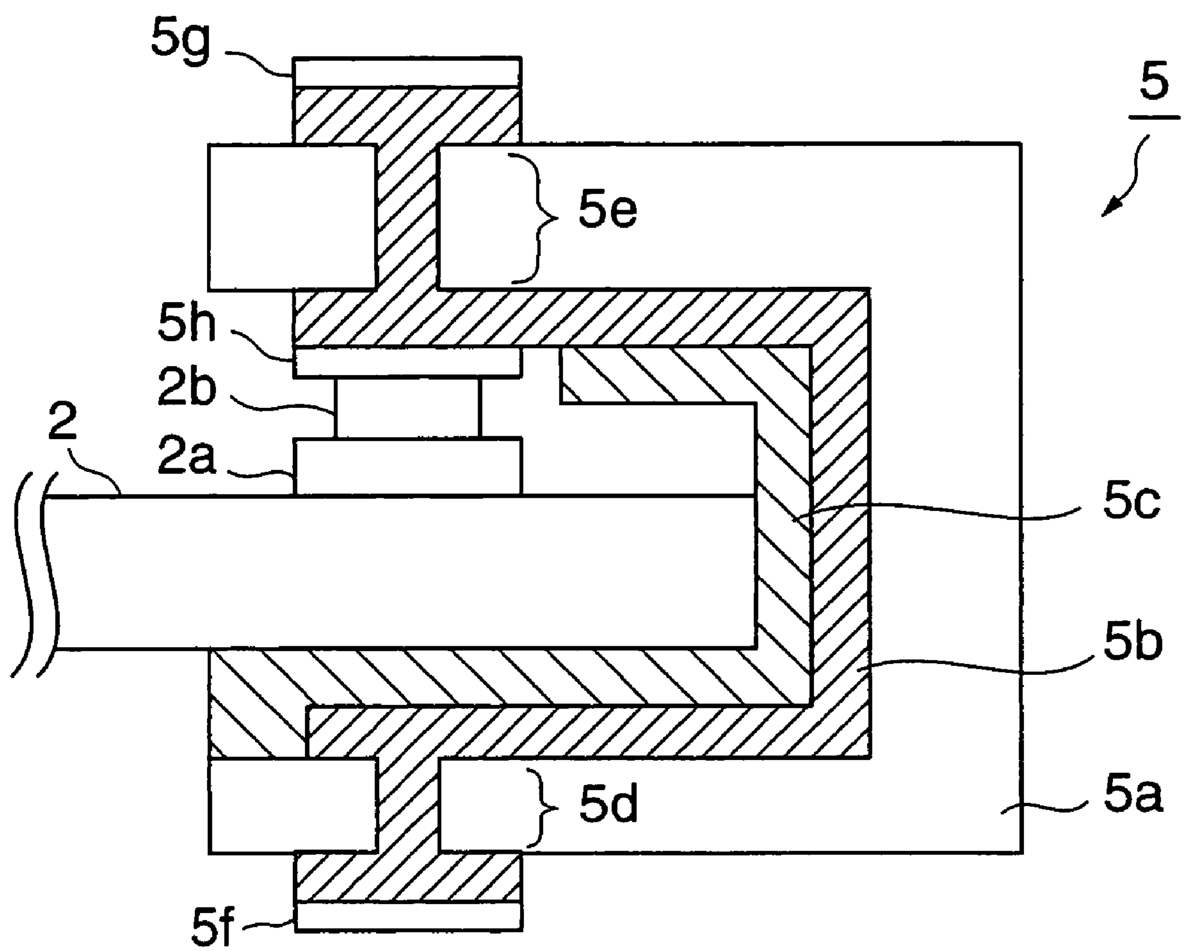
FIG. 5 is a diagram showing the wiring method of FIG. 4 in detail.

In the aforementioned manner, the wiring connection portions 1*a* through 3*a* of the semiconductor elements 1 through 3 are connected to the contact portion 9 of the interposer 11 via the stacking components 4 through 6. In addition, the stacking components 4 through 6 also serve to hold the semiconductor elements 1 through 3, respectively. Referring to FIG. 5, a detailed description is given of a structure using such stacking components by taking the stacking component 5 as an example.

FIG. 5 is an enlarged diagram of the stacking component 5 and the semiconductor element 2. In FIG. 5, those parts that are described above are designated by the same reference numerals, and a description thereof is partially omitted.

In such a structure, the semiconductor element 2 is, for example, a Si semiconductor chip having a thickness of 25 μm or more, provided with an active element (not shown) and a passive element (not shown), and having the wiring connection portion 2*a* that is made of, for example, Al and is electrically connected to the above-mentioned elements. Further, the wiring contact portion 2*b* is formed on the wiring connection portion 2*a*.

As mentioned above, the wiring substrate 5*a* is provided to extend along the bottom surface, the side surface, and the outer edge of the top surface of the semiconductor element 2. The wiring substrate 5*a* is a thin film of an insulating body made of, for example, polyimide having a thickness of approximately 20–75 μm.

The wiring part 5*b* formed inside the wiring substrate 5*a* is made of copper (Cu) having a thickness of 2–10 μm.

The protection layer 5*c*, which is formed to cover the wiring part 5*b*, is formed by a thin film made of an insulating body having a tacking property, for example, a polyimide film having a thickness of 5 μm. When a double-faced polyimide tape having adhesion is used for the protection layer 5*c*, for example, it is possible to fix the wiring part 5*b* and the wiring substrate 5*a* to the semiconductor element 2 with the adhesive power of the double-faced tape. Hence, it becomes unnecessary to use a coagulating agent for fixing such as MOLD resin.

The wring part 5*b* extends outside of the wiring substrate 5*a* via a throughhole 5*d* formed in the wiring substrate 5*a,* which throughhole 5*d* is provided on the bottom-surface side of the semiconductor element 2. The wiring electrode 5*f* is formed by forming a solder plating layer (10 μm) on a Ni (2 μm)/Au (0.5 μm) plating layer.

Similarly, the wiring part 5*b* extends outside of the wiring substrate 5*a* via a throughhole 5*e* formed in the wiring substrate 5*a* on the top-surface side of the semiconductor element 2. The wiring electrode 5*g* is formed by forming a solder plating layer (10 μm) on a Ni (2 μm)/Au (0.5 μm) plating layer.

The wiring part 5*b* and the wiring contact portion 2*b* are electrically connected to each other via the contact electrode 5*h* formed on a surface of the wiring part 5*b*. The contact electrode 5*h* is formed by forming a solder plating layer (10 μm) on a Au stud bump or a Ni (2 μm)/Au (0.5 μm) plating layer.

With a stacked semiconductor device using stacking components according to the present invention, wiring is formed along the outer edges of semiconductor elements. Hence, it is possible to further reduce the size of a stacked semiconductor device compared to a stacked semiconductor device using conventional wire bonding, since wiring spaces for wire bonding are not required.

Further, it is easy to form a stacked structure by providing a semiconductor element on the top surface or the bottom surface of another semiconductor element. That is, as mentioned above, it is possible to form a stacked structure in which a semiconductor element having the same size as or a larger size than another semiconductor element is mounted thereon. Accordingly, a limit imposed on the sizes of semiconductor elements to be stacked is eliminated, and flexibility in designing a stacked semiconductor device is increased.

Additionally, in the stacking component 5, surfaces of the wiring part 5*b,* which surfaces contact the semiconductor element 2, are covered by the protection layer 5*c* made of an insulating body. Hence, when using the stacking component 5, it is unnecessary to form an insulating film on surfaces of the semiconductor element 2, which surfaces opposing to the wiring part 5*b*.

Further, when using and implementing multiple stacked semiconductor devices according to the present invention, since the wiring part 5*b* is covered by the wiring substrate 5*a,* there is no problem that the wiring part 5*b* contacts a wiring part of an adjacent stacked semiconductor device and an electrical short occurs. Hence, it is possible to provide stacked semiconductor devices according to the present invention with a narrow pitch.

Additionally, in the case where the stacking component 5 is used and wiring is made by using the wiring part 5*b,* it is possible to form wiring with less variations in the wiring length, compared to the case of using conventional wire bonding. More specifically, it is possible to form wiring having the same wiring length and having a high degree of accuracy, which is advantageous in electric property and speeding up, considering SiP (System in Package) whose performance will be improved in the future.

Figure 6A:
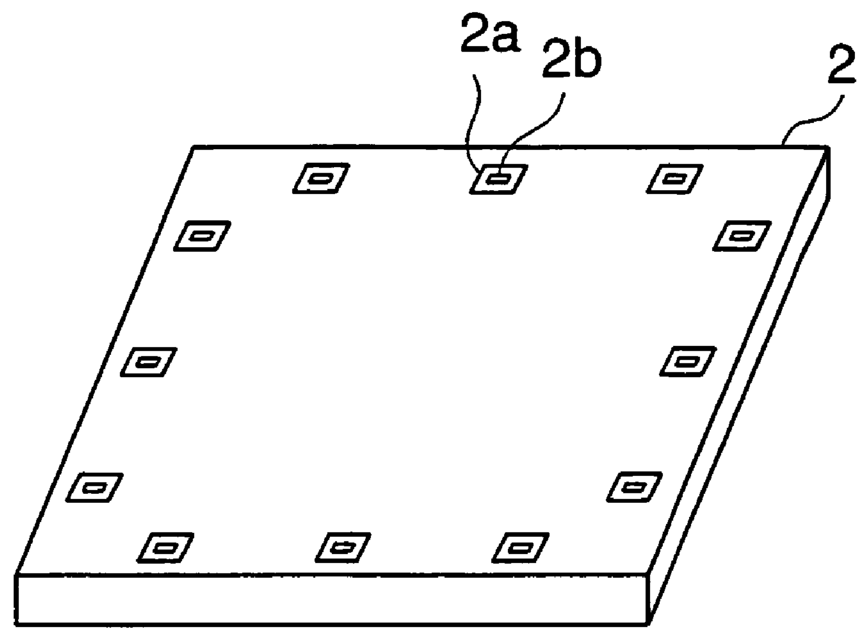
FIG. 6A is a general perspective view of a semiconductor element.
Figure 6B:
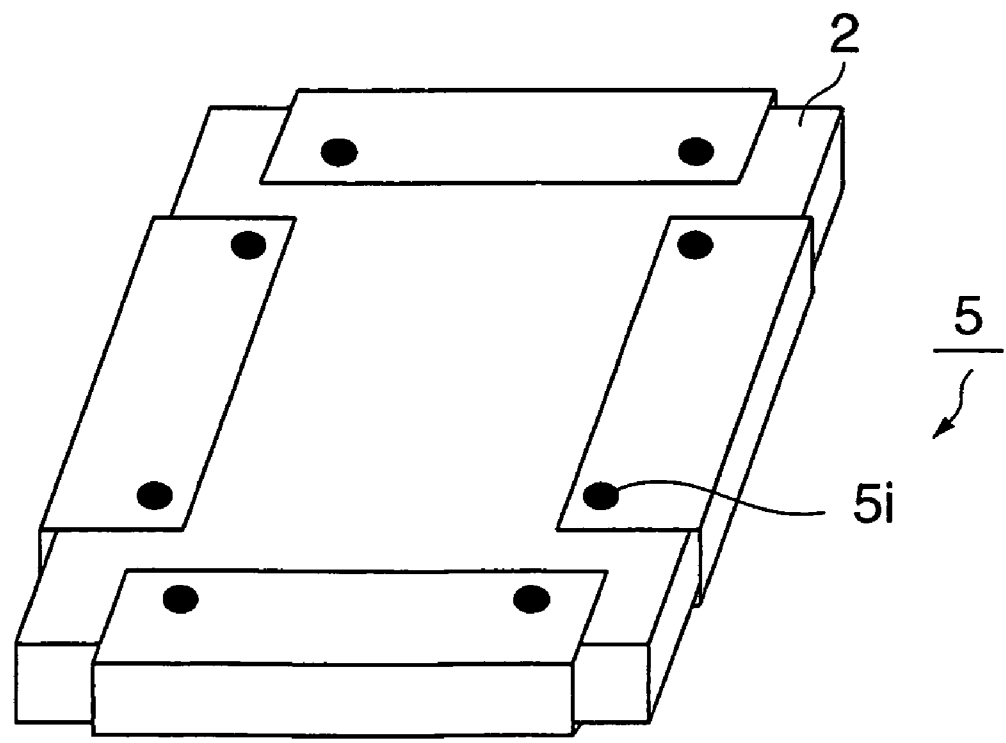
FIG. 6B is a general perspective view of the semiconductor element shown in FIG. 6A to which stacking components are attached.

Next, referring to FIGS. 6A and 6B, a description is given of a method of attaching the above-mentioned stacking component to a semiconductor element. In FIGS. 6A and 6B, those parts that are described above are designated by the same reference numerals, and a description thereof is omitted.

FIG. 6A is a perspective view of the semiconductor device 2. As mentioned above, an active element (not shown) and a passive element (not shown), for example, are formed on the semiconductor element 2. The wiring connection portions 2*a,* which are connected to the above-mentioned elements, are provided on the semiconductor element 2. Further, the wiring contact portions 2*b* are provided on the wiring connection portions 2*a*.

FIG. 6B is a perspective view of the semiconductor element 2 to which the above-mentioned stacking components 5 are attached. FIG. 6B shows a case where four stacking components 5 are attached to the semiconductor element 2. When attaching the stacking component 5 to the semiconductor element 2, it is necessary that the contact electrode 5*h* (not shown in FIG. 6B but shown in FIG. 5) contacts the wiring contact portion 2*b*. Since accurate positioning is required, the stacking component 5 is provided with alignment marks 5*i*.

It is also possible to conduct an individual performance test in the state shown in FIG. 6B, i.e., the state where stacking components 5 are attached to the semiconductor element 2, before stacking semiconductor elements to which the respective stacking components are attached.

Figure 7A:
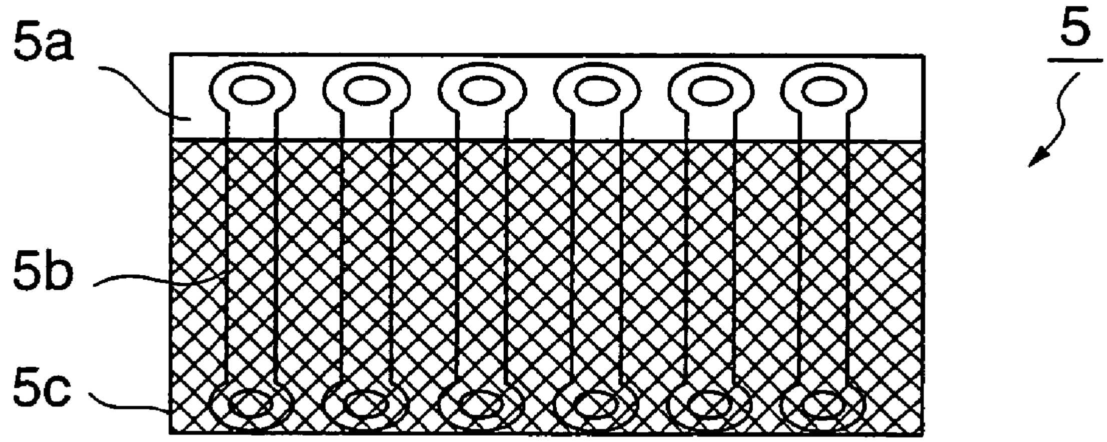
FIG. 7A is a plan view of a stacking component according to the present invention.
Figure 7B:
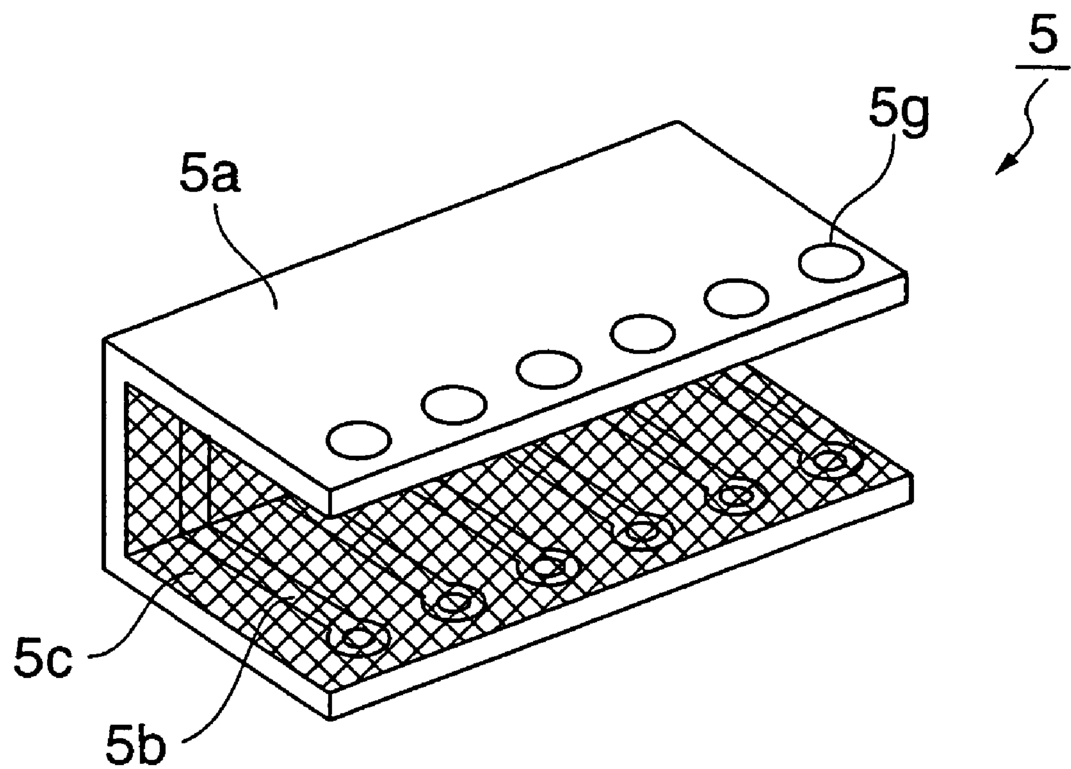
FIG. 7B is a perspective view of the stacking component shown in FIG. 7A that is bent and formed into a shape to be attached to a semiconductor element.

Next, referring to FIGS. 7A and 7B, a description is given of a manufacturing method of the stacking component.

FIG. 7A is a diagram showing the stacking component 5, which is to be bent in a substantially U-shape as shown in FIG. 7B, developed in a two-dimensional manner. The stacking component 5 is manufactured in the following manner.

First, the wiring part 5*b* is formed on a surface of the wiring substrate 5*a* made of polyimide. The wiring part 5*b* is made of, for example, Cu, and corresponds to the thickness of the semiconductor element 2 and the positions of the wiring contact portions 2*b*.

Further, the protection layer 5*c* made of, for example, polyimide is formed to cover a part of the wiring part 5*b,* thereby forming the stacking component 5.

The reason for using polyimide for the wiring substrate 5*a* and the protection layer 5*c* is that a process for forming a stacked semiconductor device includes processes using a high temperature such as a MOLD process (175° C.), a solder reflowing process (240° C.), and thermal process (260° C.) in substrate mounting, and thus heat resisting properties are required. Other material may also be used as long as the material is an insulating body having heat resisting properties.

FIG. 7B is a perspective view of the stacking component 5 that is bent in a substantially U-shape to be attached to the semiconductor element 2.

Figure 8A:
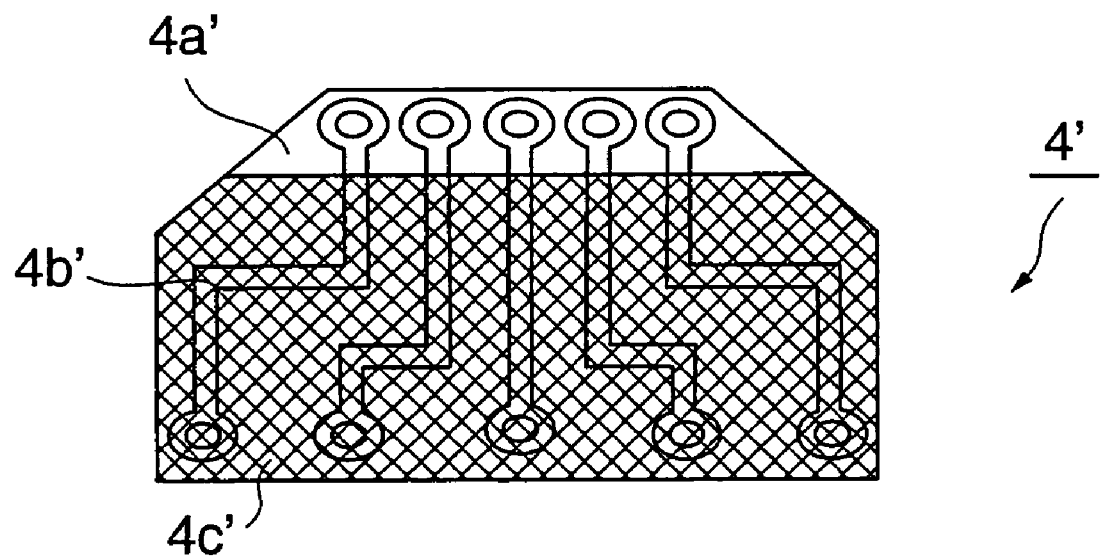
FIG. 8A is a plan view of another stacking component according to the present invention.
Figure 8B:
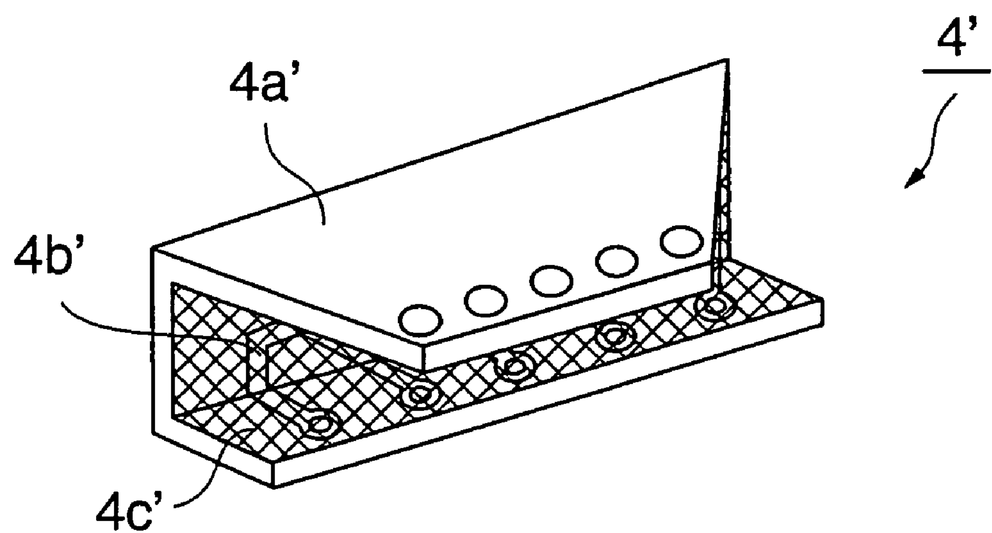
FIG. 8B is a perspective view of the stacking component shown in FIG. 8A that is bent and formed into a shape to be attached to a semiconductor element.

The stacking component 5 is a stacking component used in the case where the semiconductor element 2 and a semiconductor element having the same size as the semiconductor element 2 are stacked. FIGS. 8A and 8B show a manufacturing method of a stacking component used in the case where semiconductor elements of different sizes are stacked.

FIG. 8A is a plan view showing the stacking component 4', which is shown in FIG. 3, in a developed manner. The stacking component 4' is to be bent in a substantially U-shape, and is used for stacking semiconductor elements of different sizes.

Referring to FIG. 8A, the wiring substrate 4*a*' made of polyimide has a shape formed by combining a trapezoid and a rectangle as shown in FIG. 8A, in order to stack semiconductor elements of different sizes. A wiring part 4*b*' is formed on the wiring substrate 4*a*'. The wiring part 4*b*' is made of, for example, Cu and corresponds to a semiconductor element held by the stacking component 4' and to a wiring contact portion of another semiconductor element to be stacked on the semiconductor element.

Further, a protection layer 4*c*' made of, for example, polyimide is formed to cover a part of the wiring parts 4*b*', thereby forming the stacking component 4'.

FIG. 8B is a perspective view of the stacking component 4' bent in a substantially U-shape to be attached to a semiconductor element. As shown in FIG. 3, the semiconductor element 1 is held by the stacking component 4', and the semiconductor element 2', having a smaller size than the semiconductor element 1, is stacked on the stacking component 4'.

Next, referring to FIGS. 9A through 13B, a description is given of a method of attaching the stacking component to a semiconductor element.

Figure 9A:
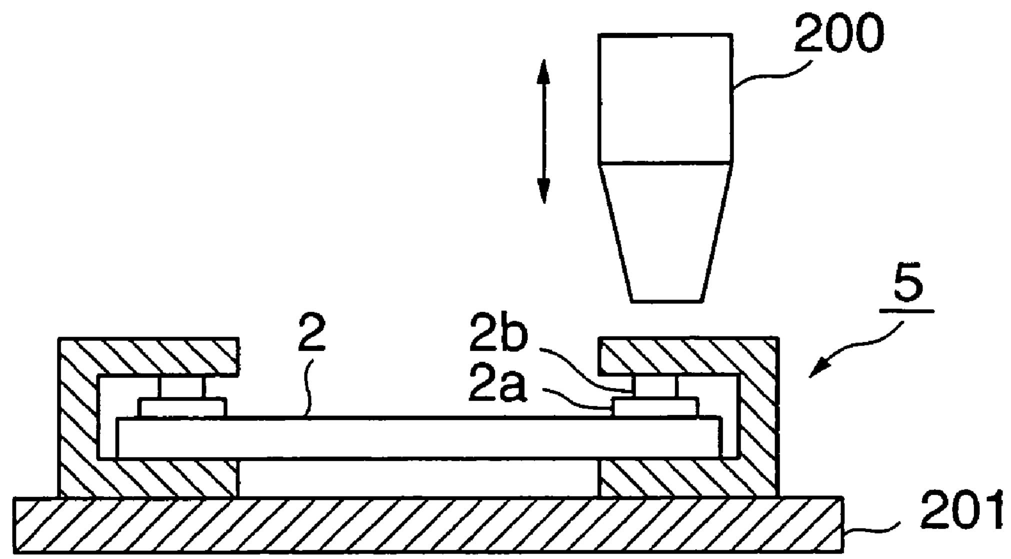
FIG. 9A is a cross-sectional view for explaining a connection method of wiring of a semiconductor element according to the present invention.
Figure 9B:
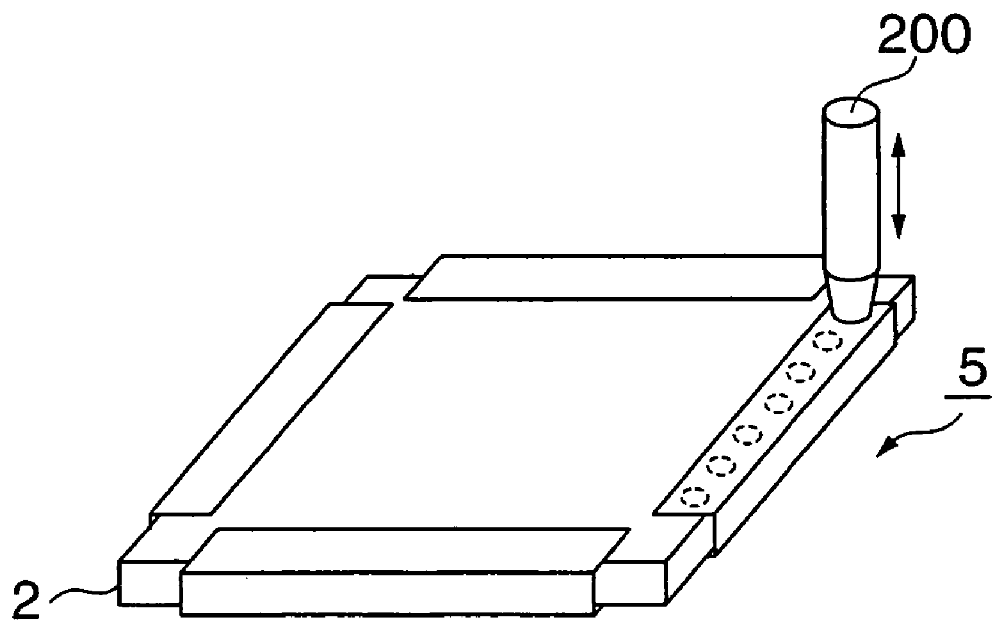
FIG. 9B is a perspective view for explaining the connection method of wiring of a semiconductor element shown in FIG. 9A.

FIGS. 9A and 9B are diagrams for explaining a method of attaching the stacking component 5 to the semiconductor element 2. FIG. 9A is a cross-sectional view and FIG. 9B is a perspective view of the stacking component 5, the semiconductor element 2, and a connecting tool 200. In FIGS. 9A and 9B, those parts that are described above are designated by the same reference numerals, and a description thereof is omitted.

Referring to FIG. 9A, the semiconductor element 2 is contained in a U-shaped space of the stacking component 5, which is bent in a substantially U-shape. The stacking component 5 is placed on a block 201 with temperature control. While performing temperature control of the stacking component 5 and the semiconductor element 2 by the block 201 with temperature control, the wiring contact portions 2*b* and the contact electrodes 5*h* (not shown in FIG. 9A but shown in FIG. 5) of the stacking component 5 are electrically connected to each other by the connecting tool 200. The connection is made by a reflowing process of a solder, which is a part of constituent materials of the contact electrode 5*h*. The connection is made for each of the pairs of the wiring contact portion 2*b* and the contact electrode 5*h*.

FIG. 9B is a perspective view of the stacking component 5, the semiconductor element 2, and the connecting tool 200, which are shown in FIG. 9A. FIG. 9B is for explaining the method of attaching the stacking component 5 to the semiconductor element 2. As shown in FIG. 9B, each of the wiring contact portions 2*b* is connected to a corresponding one of the contact electrode 5*h* by the connecting tool 200. In addition, the method shown in FIGS. 9A and 9B may be varied as shown in FIGS. 10A and 10B.

Figure 10A:
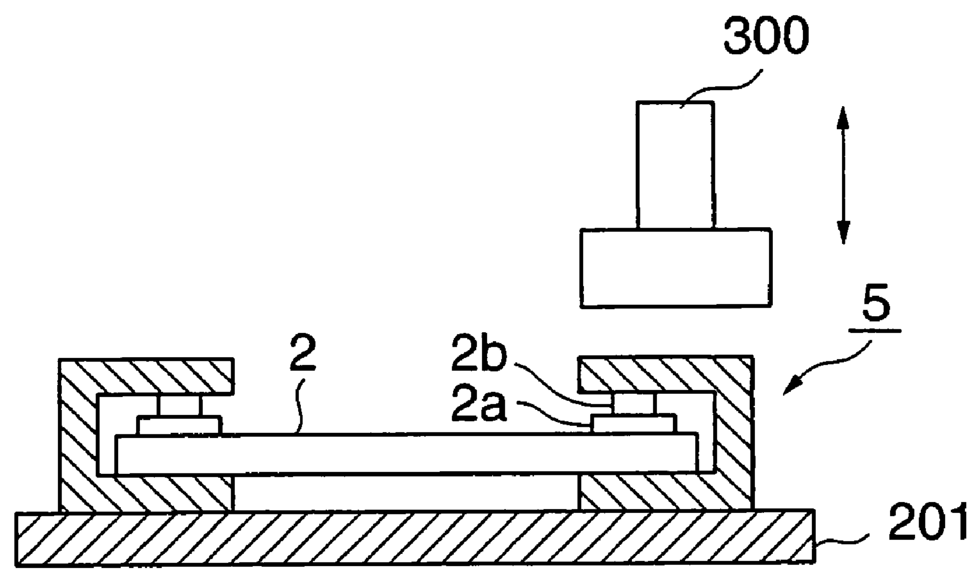
FIG. 10A is a cross-sectional view for explaining another connection method of wiring of a semiconductor element according to the present invention.
Figure 10B:
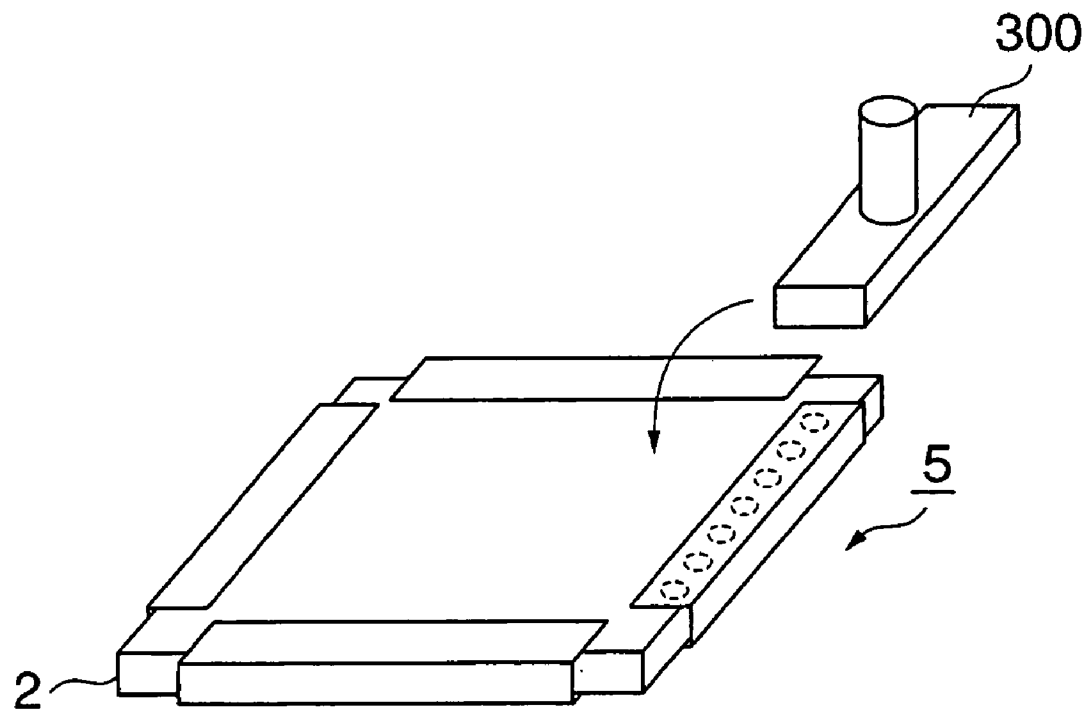
FIG. 10B is a perspective view for explaining the connection method of wiring of a semiconductor element shown in FIG. 10A.

FIGS. 10A and 10B are diagrams for explaining a variation of the method of attaching the stacking component 5 to the semiconductor element 2, which method is shown in FIGS. 9A and 9B. FIG. 10A is a cross-sectional view and FIG. 10B is a perspective view of the stacking component 5, the semiconductor element 2, and a connecting tool 300. In FIGS. 10A and 10B, those parts that are described above are designated by the same reference numerals, and a description thereof is omitted.

Referring to FIG. 10A, the connecting tool 200 used in FIG. 9A is replaced with the connecting tool 300. This is because the shape of the connecting tool is varied in order to simultaneously connect a plurality of the wiring contact portions 2*b* to the respective contact electrode 5*h*.

Referring to FIG. 10B, a plurality of the wiring contact portions 2*b* are simultaneously connected to the respective contact electrodes 5*h* by the connecting tool 300. Hence, compared to the method described with reference to FIGS. 9A and 9B, the efficiency of a connecting operation of the wiring contact portions 2*b* to the contact electrodes 5*h* is improved.

Figure 11A:
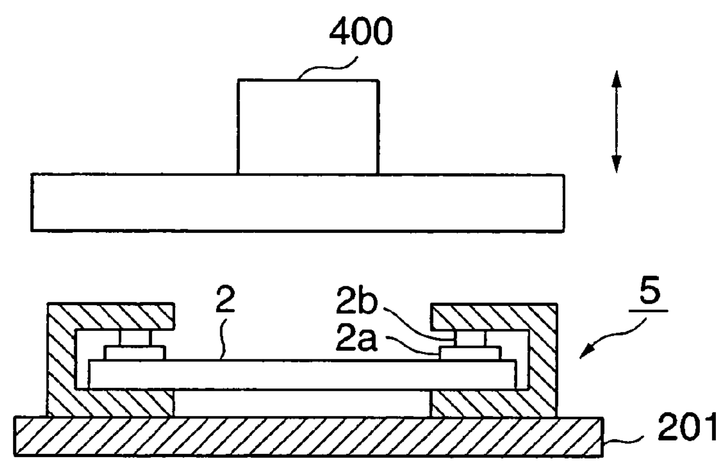
FIG. 11A is a cross-sectional view for explaining another connection method of wiring of a semiconductor element according to the present invention.
Figure 11B:
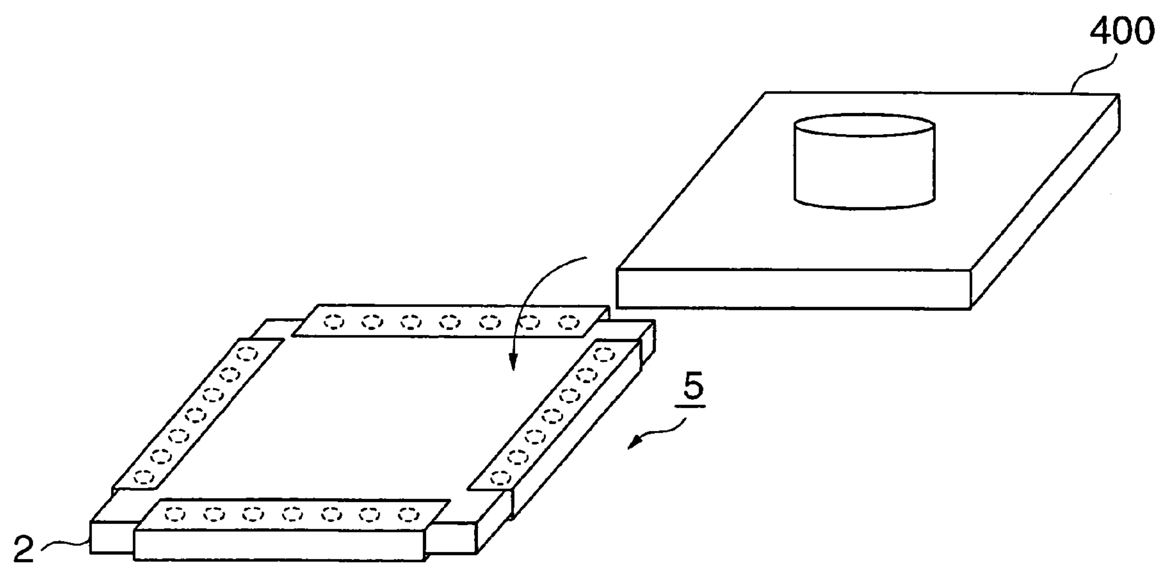
FIG. 11B is a perspective view for explaining the connection method of wiring of a semiconductor element shown in FIG. 11A.

Additionally, in order to further improve the efficiency of the connecting operation of the wiring contact portions 2*b* to the contact electrodes 5*h*, the method may be varied as shown in FIGS. 11A and 11B. In FIGS. 11A and 11*b*, those parts that are described above are designated by the same reference numerals, and a description thereof is omitted.

Referring to FIG. 11A, a connecting tool 400, which is a further larger tool than the connecting tool 300, is used. In the method shown in FIGS. 11A and 11B, all of the wiring contact portions 2*b* to be connected to the respective contact electrodes 5*h* are simultaneously connected thereto by using the connecting tool 400.

FIG. 11B is a perspective view of the stacking components 5, the semiconductor element 2, and the connecting tool 400, which are shown in FIG. 11A. All of the wiring contact portions 2*b* of a plurality of the stacking components 5 are simultaneously connected to the respective contact electrodes 5*h*. Hence, compared to the method shown in FIGS. 10A and 10B, it is possible to further improve the efficiency of the connecting operation.

Figure 12A:
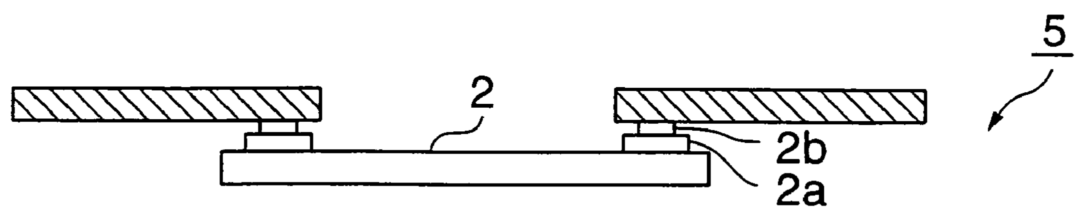
FIG. 12A is a cross-sectional view for explaining a connection method of wiring of a semiconductor element according to the present invention.
Figure 12B:
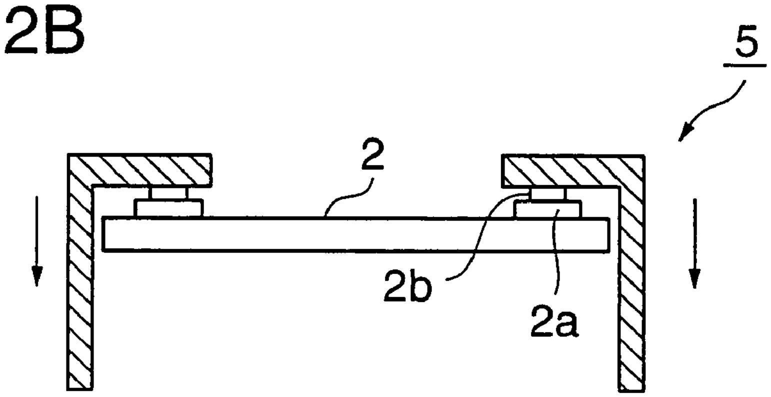
FIG. 12B is a cross-sectional view for explaining the connection method of wiring of a semiconductor element according to the present invention.
Figure 12C:
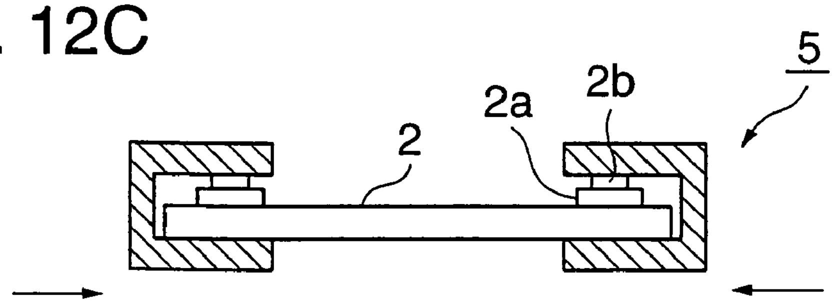
FIG. 12C is a cross-sectional view for explaining the connection method of wiring of a semiconductor element according to the present invention.

Next, referring to FIGS. 12A through 12C, a description is given of exemplary processes of the above-mentioned method in a sequential order.

FIGS. 12A through 12C show processes for attaching the stacking component 5 to the semiconductor element 2 in a sequential order. In FIGS. 12A through 12C, those parts that are described above are designated by the same reference numerals, and a description thereof is omitted.

Referring to FIG. 12A, first, a connecting operation of connecting the contact electrodes 5*h* (not shown in FIG. 12A but shown in FIG. 5), having planar shapes, of the stacking portion 5 are connected to the wiring contact portions 2*b*.

Then, as shown in FIG. 12B, a bending process of the stacking component is performed. In the bending process, first, the stacking component 5 is bent to extend along the top surface and side surfaces of the semiconductor element.

Next, as shown in FIG. 12C, the stacking component 5 is bent to further extend along the bottom surface of the semiconductor element 2. In the aforementioned manner, the attachment of the stacking component 5 to the semiconductor element 2 is completed. In addition, the process shown in FIGS. 12A through 12C may be varied as shown in FIGS. 13A and 13B.

Figure 13A:
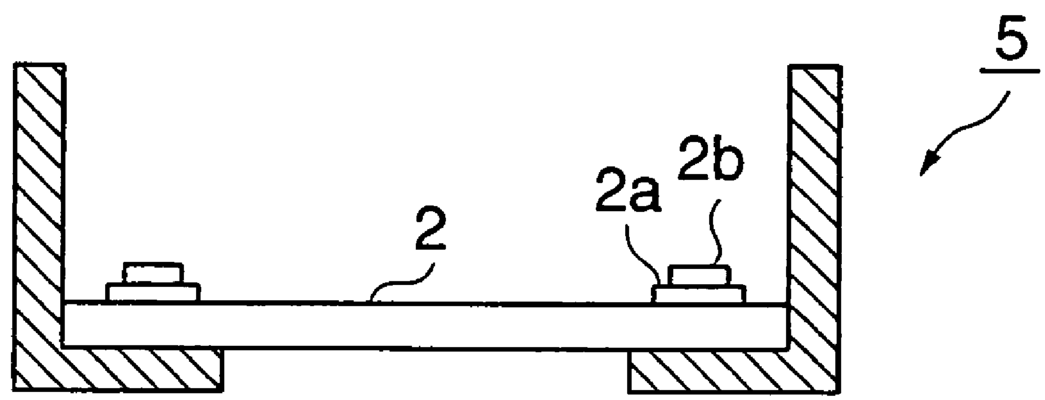
FIG. 13A is a cross-sectional view for explaining a connection method of wiring of a semiconductor element according to the present invention.
Figure 13B:
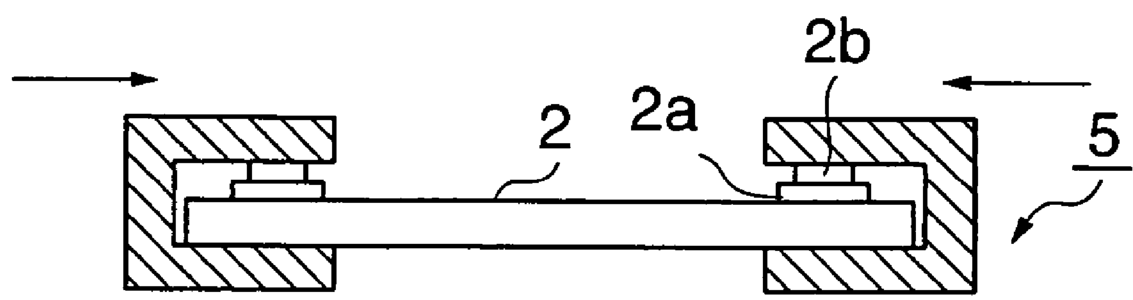
FIG. 13B is a cross-sectional view for explaining the connection method of wiring of a semiconductor element according to the present invention.

FIGS. 13A and 13B show processes of attaching the stacking component 5 to the semiconductor element 2 in a sequential order. In FIGS. 13A and 13*b*, those parts that are described above are designated by the same reference numerals, and a description thereof is omitted.

Referring to FIG. 13A, first, the stacking component 5, which is bent into a shape shown in FIG. 13A in advance, is arranged to follow the bottom surface and side surfaces of the semiconductor element 2.

Then, as shown in FIG. 13B, the stacking component 5 is bent. Thereafter, as mentioned above with reference to FIGS. 9A and 9B, the wiring contact portions 2*b* and the contact electrodes 5*h* are connected to each other. The method for connecting the wiring contact portions 2*b* to the contact electrodes 5*h* may be the method shown in FIGS. 10A and 10B, or the method shown in FIGS. 11A and 11B.

As mentioned above, the procedures for connecting the wiring contact portions 2*b* to the contact electrodes 5*h*, and bending the stacking component 5 so as to attach the stacking component 5 to the semiconductor element 2 may be arbitrarily varied. Even if the procedure is varied, the stacking component 5 may be similarly attached to the semiconductor element 2.

Next, referring to FIGS. 14A through 15B, a description is given of an embodiment of a stacked semiconductor device that is formed by using the stacking components.

Figure 14A:
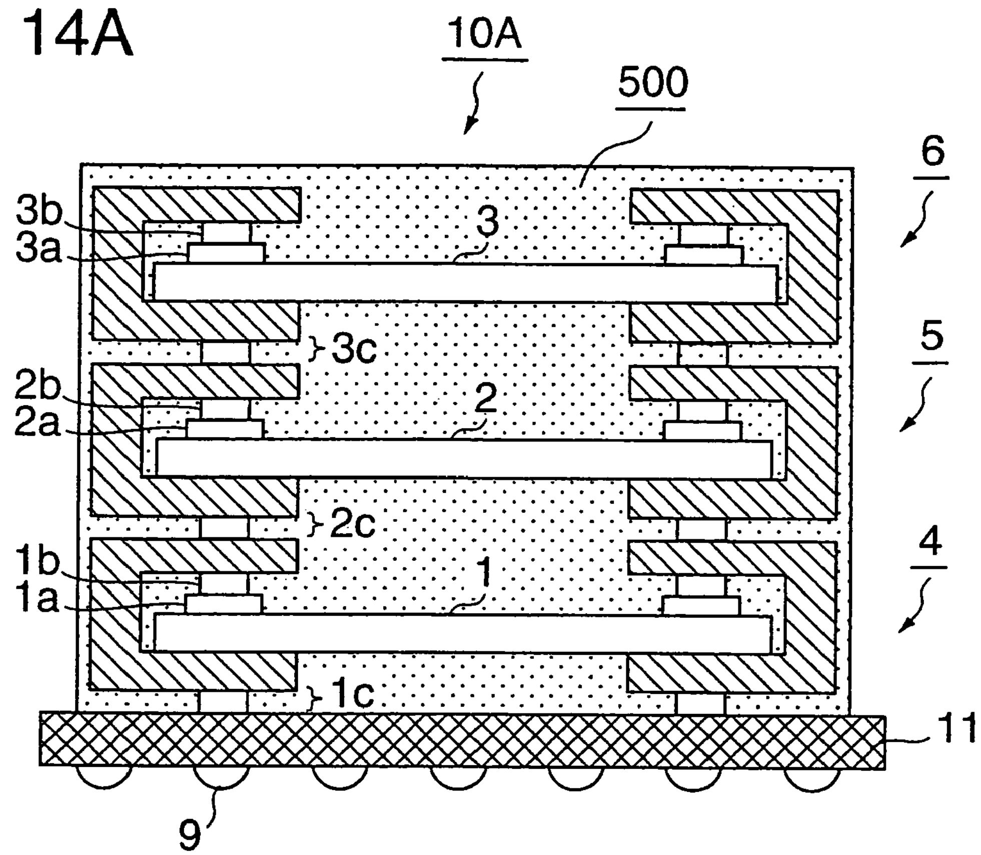
FIG. 14A is a diagram showing a structure in which the stacked semiconductor device shown in FIG. 2 is fixed by MOLD resin.
Figure 14B:
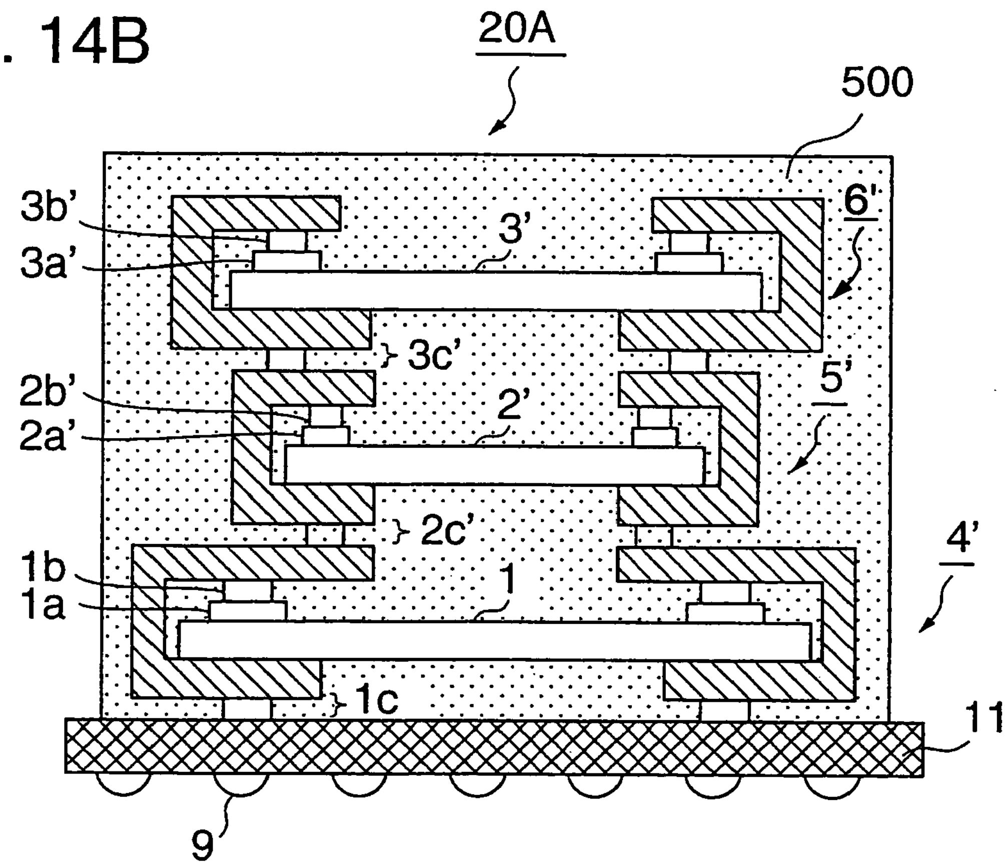
FIG. 14B is a diagram showing a structure in which the stacked semiconductor device shown in FIG. 3 is fixed by MOLD resin.

FIGS. 14A and 14B show stacked semiconductor devices 10A and 20A formed by using the stacking components according to the present invention, respectively. In FIGS. 14A and 14B, those parts that are described above are designated by the same reference numerals, and a description thereof is omitted.

Referring to FIG. 14A, the stacked semiconductor device 10A is a variation of the stacked semiconductor device shown in FIG. 2.

In this embodiment, the semiconductor elements 1 through 3 and the stacking components 4 through 6 are fixed to the interposer 11 by a MOLD resin 500. In the case of the stacked semiconductor device the certificate management apparatus 10 shown in FIG. 2, the semiconductor elements 1 through 3 are fixed to the interposer 11 by the stacking components 4 through 6. Hence, there is an effect that the need for MOLD resin, which is required for a conventional stacked semiconductor device, is eliminated. However, in the case where the semiconductor elements 1 through 3 and the stacking components 4 through 6 are fixed by the MOLD resin 500 as shown in FIG. 14A, the stability is increased by such fixing. Accordingly, the possibility of problems, such as detachment of a semiconductor element at the time when an impact is applied to the stacked semiconductor device 10A, is further reduced. Thus, there is an effect that reliability is further improved.

FIG. 14B shows a variation of the stacked semiconductor device 20 shown in FIG. 3.

In this embodiment, the semiconductor elements 1, 2' and 3' and the stacking components 4', 5' and 6' are fixed to the interposer 11 by the MOLD resin 500. In the case where the semiconductor elements 1, 2' and 3' and the stacking components 4', 5' and 6' are fixed by the MOLD resin 500, the stability is also increased by such fixing as in the case shown in FIG. 14A. Accordingly, the possibility of problems, such as detachment of a semiconductor element at the time when an impact is applied to the stacked semiconductor device 10A, is further reduced. Thus, there is an effect that reliability is further improved.

Figure 15A:
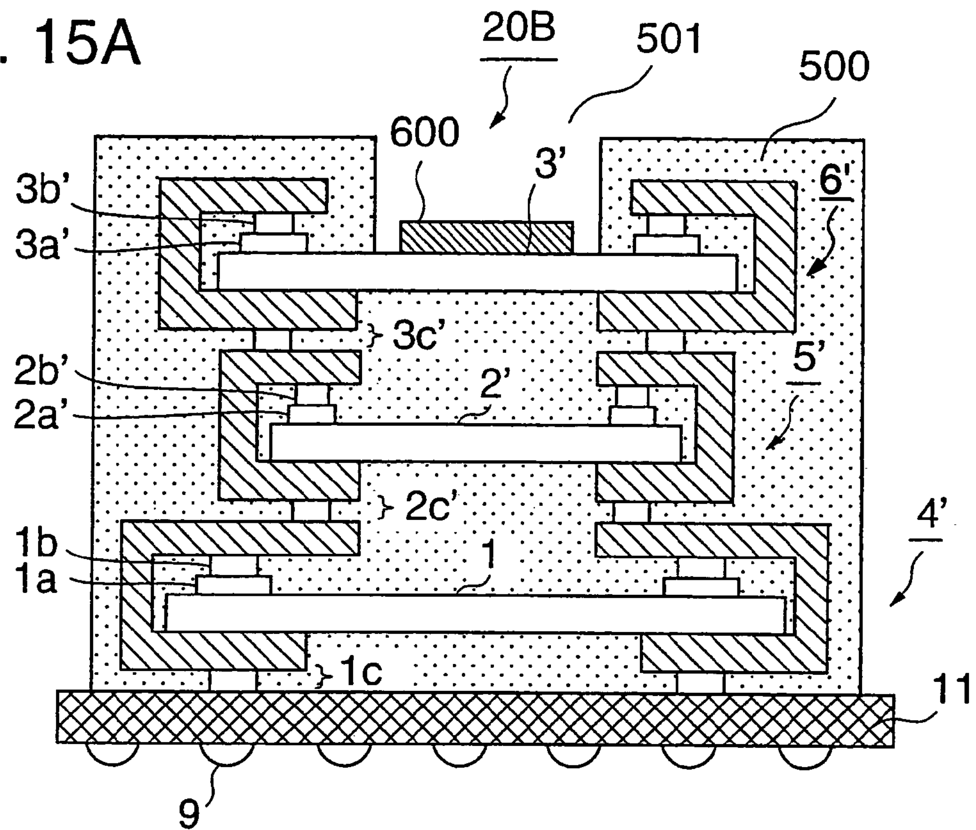
FIG. 15A is a diagram showing the structure of a photo receiver using the stacked semiconductor device shown in FIG. 14B.
Figure 15B:
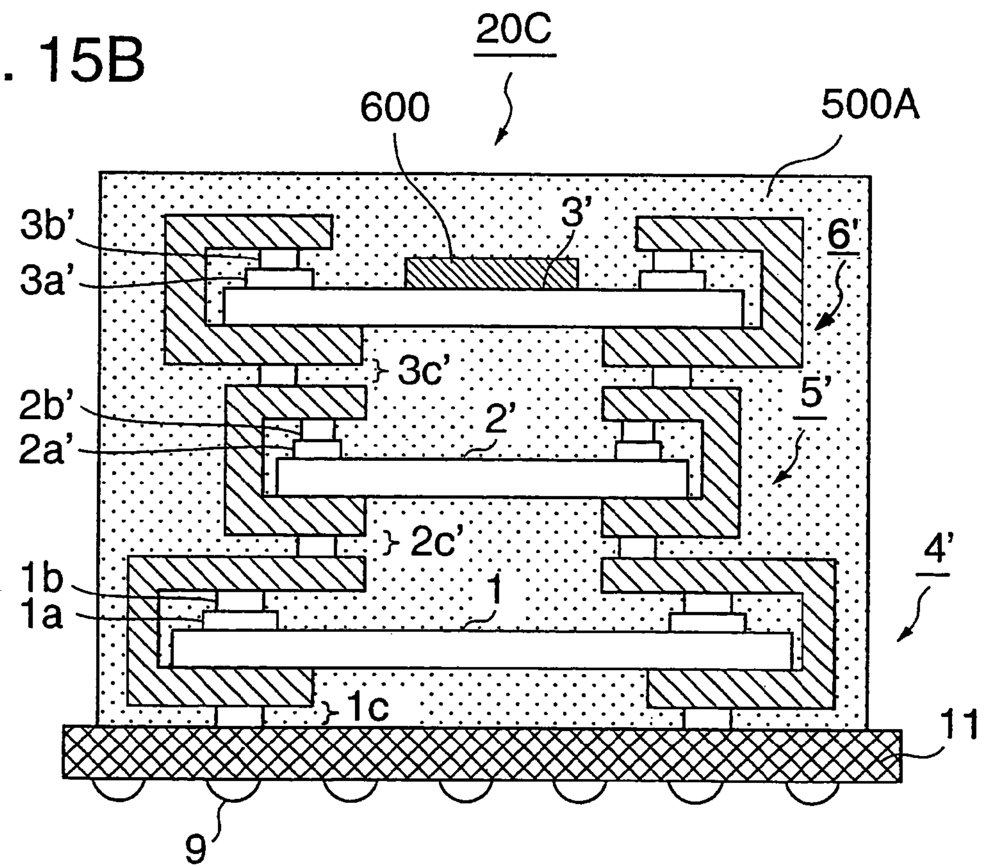
FIG. 15B is another diagram showing the structure of the photo receiver using the stacked semiconductor device shown in FIG. 14B.

FIGS. 15A and 15B show an embodiment in which a semiconductor element having a photo receiving part is mounted on the stacked semiconductor device 20A shown in FIG. 14B.

FIG. 15A is a cross-sectional view of a stacked semiconductor device 20B. The stacked semiconductor device 20B corresponds to the stacked semiconductor device 20A mounting a photo receiving part 600 on the semiconductor element 3'. In FIG. 15A, those parts that are described above are designated by the same reference numerals, and a description thereof is omitted.

In the stacked semiconductor device 20B, an opening 501 is provided in the top portion of the MOLD resin 500, and the photo receiving part 600 is mounted on the semiconductor element 3'. The photo receiving part 600 may be, for example, a fingerprint sensor or a photo-receiving device.

A drive circuit, an output circuit, an arithmetic circuit and the like are mounted on the semiconductor elements 1 and 2'. In such a stacked semiconductor device according to the present invention, the spaces for wire bonding are not required as in conventional products. Hence, it is possible to reduce the size of an entire package. In addition, it becomes possible to stack another semiconductor element in a space above the wiring connection portion of a semiconductor element. Thus, it is possible to stack, on a semiconductor element, another semiconductor element having the same size as or a larger size than the semiconductor element. That is, since a limit is not imposed on the sizes of semiconductor elements to be stacked in a stacked semiconductor device, there is an advantage that flexibility in designing the stacking semiconductor device is high. Additionally, since the wiring portions are covered by the insulating body, wiring does not contact to each other between the adjacent semiconductor devices in the case where a plurality of the stacked semiconductor devices are mounted. Hence, it is possible to realize high-density mounting.

FIG. 15B is a cross-sectional view of a stacked semiconductor device 20C, which is a variation of the stacked semiconductor device 20B shown in FIG. 15A.

In the case of the stacked semiconductor device 20C, a material that transmits light is used for a MOLD resin 500A. Hence, there is no need to form an opening in the MOLD resin 500A. With the stacked semiconductor device 20C, it is also possible to reduce the size of an entire package compared to conventional products. Additionally, also in this case, a limit is not imposed on the sizes of semiconductor elements to be stacked in a stacked semiconductor device. Hence, there is an advantage in that flexibility in designing a stacked semiconductor device is high. Further, since the wiring portions are covered by the insulating body, the wiring does not contact to each other between the adjacent semiconductor devices in the case where a plurality of the stacked semiconductor devices are mounted. Hence, it is possible to realize high-density mounting.

The present invention is not limited to the specifically disclosed embodiments, and variations and modifications may be made without departing from the scope of the present invention.

Figure 16:
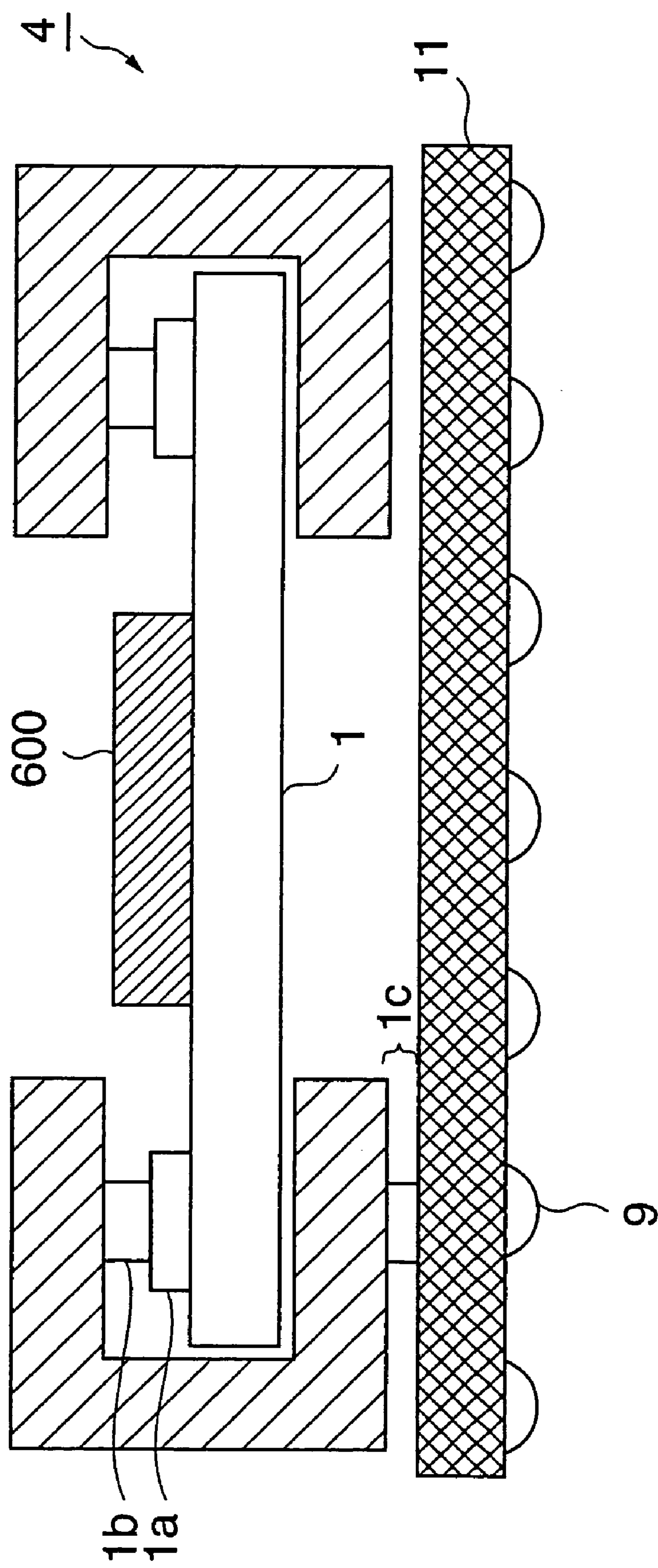
FIG. 16 is a diagram showing a variation of the stacked semiconductor device shown in FIG. 2.

For example, FIG. 16 shows a semiconductor device 10B having the photo receiving part 600 on the semiconductor element 1. The semiconductor device 10B is constructed by using only the semiconductor element 1 and the stacking component 4 of the stacked semiconductor device 10 shown in FIG. 2, without using the semiconductor elements 2 and 3. In FIG. 16, those parts that are the same as those described above are designated by the same reference numerals, and a description thereof is omitted.

In the case of the semiconductor device 10 B, semiconductor elements are not stacked and the single semiconductor element 1 is used. In this case, it is possible to use the photo receiving part 600 as a fingerprint sensor, which has been difficult with conventional flip-chip bonding. In this case, there is an effect that, when a pressure is applied by a finger, the wiring substrate 4*a* absorbs the pressure by serving as a cushioning material.

Semiconductor devices according to the present invention may be varied or modified according to need in addition to those described above, and are not limited to the disclosed embodiments.

What is claimed is:

1. A semiconductor device that includes a semiconductor element having a plurality of electrodes arranged on one principal surface thereof and a wiring substrate having a conductive layer provided on an insulating substrate, wherein the wiring substrate includes the insulating substrate, the conductive layer formed on a surface of the insulating substrate, and an insulating protection layer selectively covering the conductive layer, and wherein the wiring substrate is arranged in a substantially U-shape along an outer edge of the semiconductor element with the insulating protection layer being an inner side so that the conductive layer faces the electrodes of the semiconductor element and the wiring substrate selectively covers a part of the one principal surface and a part of the other principal surface, an end of the conductive layer of the wiring substrate is directly connected to the electrodes of the semiconductor element on the principal surface, and the other end of the conductive layer extends in a direction opposite to the semiconductor element from a surface of the insulating substrate to an opposite surface thereof via a throughhole formed in the insulation layer on the other principal surface side of the semiconductor element.

2. The semiconductor device as claimed in claim 1, wherein the conductive layer is electrically connected to a contact portion of a mounting board mounting the semiconductor element thereon.

3. The semiconductor device as claimed in claim 1, wherein the conductive layer is electrically connected to an electrode provided in another semiconductor element.

4. The semiconductor device as claimed in claim 1, wherein the conductive layer is made of a metal material.

5. The semiconductor device as claimed in claim 1, wherein the insulating substrate is made of polyimide.

6. The semiconductor device as claimed in claim 1, wherein the insulating protection layer is made of polyimide.

7. A semiconductor device that includes a semiconductor element having a plurality of electrodes arranged on one principal surface thereof and a wiring substrate having a conductive layer provided on an insulating substrate, wherein the wiring substrate is arranged in a substantially U-shape along an outer edge of the semiconductor element so that the conductive layer faces the electrodes of the semiconductor element, an end of the conductive layer of the wiring substrate is directly connected to the electrodes of the semiconductor element, and the other end of the conductive layer extends in a direction opposite to the semiconductor element on the other principal surface side of the semiconductor element, wherein the wiring substrate includes the insulating substrate, the conductive layer formed on a surface of the insulating substrate, and an insulating protection layer selectively covering the conductive layer, wherein the insulating protection layer is adhesive, and the wiring substrate is fixed to the semiconductor element by the adhesive.

8. The semiconductor device as claimed in claim 7, wherein the insulating protection layer is a double-faced tape made of an insulating resin.

9. A stacked semiconductor device formed by stacking a plurality of semiconductor elements by using the semiconductor device as claimed in claim 1.

10. The semiconductor device as claimed in claim 7, wherein the conductive layer extends from a surface of the insulating substrate to an opposite surface thereof via a throughhole formed in the insulating layer.

11. The semiconductor device as claimed in claim 1, wherein the wiring substrate comprises a plurality of stacking components separately positioned along the outer edges of the semiconductor element.

12. The semiconductor device as claimed in claim 1, wherein the wiring substrate is arranged in a substantially u-shape only along an outer edge of the semiconductor element.

* * * * *